(12) United States Patent
Hu et al.

(10) Patent No.: US 9,935,287 B2
(45) Date of Patent: Apr. 3, 2018

(54) ARRAY SUBSTRATE AND MANUFACTURING METHOD THEREFOR, AND DISPLAY DEVICE

(71) Applicant: BOE TECHNOLOGY GROUP CO., LTD., Beijing (CN)

(72) Inventors: Chunjing Hu, Beijing (CN); Huifeng Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/122,153

(22) PCT Filed: Jun. 30, 2015

(86) PCT No.: PCT/CN2015/082878
§ 371 (c)(1),
(2) Date: Aug. 26, 2016

(87) PCT Pub. No.: WO2016/101576
PCT Pub. Date: Jun. 30, 2016

(65) Prior Publication Data
US 2016/0365531 A1  Dec. 15, 2016

(30) Foreign Application Priority Data

Dec. 24, 2014 (CN) .................. 2014 1 0818516

(51) Int. Cl.
*H01L 51/52* (2006.01)
*H01L 27/32* (2006.01)
*H01L 51/00* (2006.01)

(52) U.S. Cl.
CPC ...... *H01L 51/5209* (2013.01); *H01L 27/3246* (2013.01); *H01L 27/3258* (2013.01); *H01L 51/0021* (2013.01); *H01L 2227/323* (2013.01)

(58) Field of Classification Search
CPC ............ H01L 51/5209; H01L 27/3246; H01L 27/3258; H01L 51/0021; H01L 2227/323
See application file for complete search history.

(56) References Cited

U.S. PATENT DOCUMENTS 7,199,516 B2 * 4/2007 Seo .................. H01L 27/3246
                                                    313/504
7,244,158 B2 * 7/2007 Kimura .............. H01L 51/0005
                                                    445/24

(Continued)

FOREIGN PATENT DOCUMENTS

CN  103928497 A  7/2014
CN  103928626 A  7/2014

(Continued)

OTHER PUBLICATIONS

First Chinese Office Action (including English translation) dated Oct. 25, 2016, for corresponding Chinese Application No. 201410818516.7.

(Continued)

*Primary Examiner* — William Coleman
(74) *Attorney, Agent, or Firm* — Kinney & Lange, P.A.

(57) ABSTRACT

Disclosed is an array substrate and a method for manufacturing the same and a display device. The array substrate comprises: a substrate; a first electrode layer formed on the substrate; a pixel defining layer formed on the first electrode layer and having an opening for exposing the first electrode layer; and an organic material functional layer formed on a region of the first electrode layer corresponding to the opening. The first electrode layer comprises: a first region located at a central portion of the first electrode layer; a second region located between a periphery of the first region and an inner side of the pixel defining layer, the second region being formed as a first arc structure protruding toward the substrate; and a third region located outside the (Continued)

second region and covered by the pixel defining layer. The thicknesses, at positions of respective films of the organic material functional layer in the display device, are uniform. Non-uniform brightness of the display device is avoided, improving display quality of images of the display device.

14 Claims, 5 Drawing Sheets

(56) References Cited

U.S. PATENT DOCUMENTS

| | | | | |
|---|---|---|---|---|
| 7,903,055 | B2* | 3/2011 | Nishikawa | H01L 51/5209 257/40 |
| 9,000,426 | B2* | 4/2015 | Takii | H01L 27/3262 257/40 |
| 9,029,844 | B2* | 5/2015 | Choi | H01L 27/3246 257/40 |
| 9,093,399 | B2* | 7/2015 | Sonoda | G02B 5/201 |
| 9,583,739 | B2* | 2/2017 | Hirakata | H01L 51/5209 |
| 9,608,045 | B2* | 3/2017 | Matsumoto | H01L 27/322 |
| 2006/0119259 | A1 | 6/2006 | Bae et al. | |
| 2008/0024402 | A1 | 1/2008 | Nishikawa et al. | |
| 2017/0005286 | A1* | 1/2017 | Yun | H01L 51/5209 |

FOREIGN PATENT DOCUMENTS

| | | |
|---|---|---|
| CN | 103943787 A | 7/2014 |
| CN | 104465708 A | 3/2015 |
| CN | 204257646 U | 4/2015 |

OTHER PUBLICATIONS

International Search Report and Written Opinion including English translation dated Sep. 18, 2015, for corresponding PCT Application No. PCT/CN2015/082878, 8 pages.

* cited by examiner

ARRAY SUBSTRATE AND MANUFACTURING METHOD THEREFOR, AND DISPLAY DEVICE

CROSS-REFERENCE TO RELATED APPLICATION

This application is a Section 371 National Stage Application of International Application No. PCT/CN2015/082878, filed on Jun. 30, 2015, entitled "ARRAY SUBSTRATE AND MANUFACTURING METHOD THEREFOR, AND DISPLAY DEVICE", which claims priority to Chinese Application No. CN20141018516.7, filed on Dec. 24, 2014, incorporated herein by reference in their entirety.

BACKGROUND OF THE INVENTION

Field of the Invention

Embodiments of the disclosure generally relate to field of display technology, in particular to an array substrate and a method for manufacturing the same and a display device.

Description of the Related Art

An Organic Electroluminescent Device (OLED) has been widely used in display technique due to its advantages such as self-luminous, fast response, wide viewing angle, high brightness, brilliant color, light-weight and the like with respect to a Liquid Crystal Display (LCD). A method for forming films of the OLED mainly comprises an evaporation process and a solution process. The evaporation process has been widely used in a small-sized OLED and has realized a mass production. A forming film method based on the solution process mainly comprises ink jet printing, nozzle coating, spin coating, screen printing and the like. The ink jet printing technique may realize a mass production of a larger-size OLED due to high material utilization thereof. In the existing method for manufacturing the OLED, it is necessary to pre-form a pixel defining layer (PLD) on an electrode of a substrate so that ink droplets may accurately flow into respective RGB sub-pixel regions.

In an embodiment as shown in FIG. 1 in the prior art, the PDL 4 of the OLED generally has an isosceles trapezoidal shape. Meanwhile, the PLD 4 is often made of a hydrophobic material having a small surface energy in order to ensure that the ink droplets spread in pixels of an electrode layer 3 made of Indium Tin Oxide (ITO) without overflowing to the PDL region outside the pixels. However, a solvent in the ink droplets close to an edge of the PDL will volatilize quickly due to a surface energy difference between the ink droplets and the PDL 4 when contacting with each other and a slope angle of the PDL. Therefore, the ink droplets will be formed as an uneven thin film which is relatively thicker at an edge thereof and is relatively thinner at the middle thereof after being finally dried, i.e. coffee ring effect occurs. Due to this coffee ring effect, in respective film layers in an organic material functional layer 5 of the finally formed display device, a thickness of each film layer close to the PDL will not be uniform. An uneven film layer thickness would occur at a region 51 of the organic material functional layer, so that an uneven brightness will be generated in the display device, which in turn adversely affects display quality of image of the display device.

SUMMARY OF THE INVENTION

Embodiments of the disclosure provide an array substrate and a method for manufacturing the same which may avoid uneven brightness from being generated in a display device, thereby improving display quality of images of the display device.

According to one aspect of embodiments of the disclosure, there is provided an array substrate comprising: a substrate; a first electrode layer formed on the substrate; a pixel defining layer formed on the first electrode layer, the pixel defining layer having an opening for exposing the first electrode layer; and an organic material functional layer formed on a region of the first electrode layer corresponding to the opening. The first electrode layer comprises: a first region located at a central portion of the first electrode layer; a second region located between a periphery of the first region and an inner side of the pixel defining layer, the second region being formed as a first arc structure protruding toward the substrate; and a third region located outside the second region and covered by the pixel defining layer.

In the array substrate according to an exemplary embodiment of the disclosure, the first region is formed as a second arc structure protruding toward the substrate and smoothly connected with the first arc structure.

In the array substrate according to an exemplary embodiment of the disclosure, the first region is formed as a flat structure smoothly connected with the first arc structure.

In the array substrate according to an exemplary embodiment of the disclosure, the third region is formed as a flat structure smoothly connected with the first arc structure or as an arc structure protruding toward the substrate and smoothly connected with the first arc structure.

In the array substrate according to an exemplary embodiment of the disclosure, a region of the organic material functional layer corresponding to the second region is formed as a third arc structure protruding toward the substrate.

In the array substrate according to an exemplary embodiment of the disclosure, a region of the organic material functional layer corresponding to the first region is formed as a fourth arc structure protruding toward the substrate and smoothly connected with the third arc structure.

In the array substrate according to an exemplary embodiment of the disclosure, a region of the organic material functional layer corresponding to the first region is formed as a flat structure smoothly connected with the third arc structure.

The array substrate according to an exemplary embodiment of the disclosure further comprises a buffer layer disposed below and proximate to the first electrode layer. A region of the buffer layer corresponding to the second region is formed as a fifth arc structure protruding toward the substrate.

In the array substrate according to an exemplary embodiment of the disclosure, a region of the buffer layer corresponding to the first region is formed as a sixth arc structure protruding toward the substrate and smoothly connected with the fifth arc structure.

In the array substrate according to an exemplary embodiment of the disclosure, a region of the buffer layer corresponding to the first region is a flat structure smoothly connected with the fifth arc structure.

In the array substrate according to an exemplary embodiment of the disclosure, a region of the buffer layer corresponding to the third region is formed as a flat structure.

In the array substrate according to an exemplary embodiment of the disclosure, a vertical distance between an upper surface of the pixel defining layer and an upper surface of the first electrode layer at the lowest position thereof is less than or equal to 1.5 μm.

In the array substrate according to an exemplary embodiment of the disclosure, the first electrode layer has a thickness of 30-200 nm.

In the array substrate according to an exemplary embodiment of the disclosure, the pixel defining layer is made of a hydrophobic material.

According to a second aspect of embodiments of the disclosure, there is provided a method for manufacturing an array substrate comprising steps of: forming a first electrode layer on a substrate, the first electrode comprising a first region, a second region and a third region sequentially arranged from inside to outside, and the second region being formed as a first arc structure protruding toward the substrate; forming a pixel defining layer on the third region of the first electrode layer, and forming an opening in the pixel defining layer for exposing the first electrode layer on the first region and the second region so that the second region is located between a periphery of the first region and an inner side of the pixel defining layer; and forming an organic material functional layer on the first region and the second region of the first electrode layer corresponding to the opening.

In the method according to an exemplary embodiment of the disclosure, the step of forming a first electrode layer on a substrate comprises steps of: forming a buffer layer on the substrate; patterning the buffer layer such that the buffer layer is formed, at a side thereof away from the substrate, with a fifth arc structure, wherein the fifth arc structure corresponds to the second region of the first electrode layer and protrudes toward the substrate; and forming the first electrode layer on the buffer layer.

In the method according to an exemplary embodiment of the disclosure, the step of forming a first electrode layer on the substrate comprises steps of: forming a buffer layer on the substrate; patterning the buffer layer such that the buffer layer is formed, at a side thereof away from the substrate, with a fifth arc structure at a position corresponding to the second region and a sixth arc structure at a position corresponding to the first region, wherein both the fifth and sixth arc structures protrude toward the substrate and are smoothly connected with each other; and forming the first electrode layer on the buffer layer, so that the first region of the first electrode layer is formed as a second arc structure protruding toward the substrate and smoothly connected with the first arc structure.

In the method according to an exemplary embodiment of the disclosure, the step of forming the first electrode layer on the substrate comprises steps of: forming a buffer layer on a substrate; patterning the buffer layer such that the buffer layer is formed, at a side thereof away from the substrate, with a fifth arc structure at a position corresponding to the second region and a flat structure at a position corresponding to the first region, wherein the flat structure is smoothly connected with the fifth arc structure; and forming the first electrode layer on the buffer layer, so that the first region is formed as a flat structure smoothly connected with the first arc structure.

In the method according to an exemplary embodiment of the disclosure, in the step of forming the organic material functional layer on the region of the first electrode layer corresponding to the opening, a region of the organic material functional layer corresponding to the second region is formed as a third arc structure protruding toward the substrate.

In the method according to an exemplary embodiment of the disclosure, in the step of forming the organic material functional layer on the first region and the second region of the first electrode layer corresponding to the opening, a region of the organic material functional layer corresponding to the first region is formed as a fourth arc structure protruding toward the substrate and smoothly connected with the third arc structure.

In the method according to an exemplary embodiment of the disclosure, in the step of forming the organic material functional layer on the first region and the second region of the first electrode layer corresponding to the opening, a region of the organic material functional layer corresponding to the first region is formed as a flat structure smoothly connected with the third arc structure.

In the method according to an exemplary embodiment of the disclosure, a region of the first electrode layer corresponding to the third region is formed as a flat structure smoothly connected with the first arc structure.

In the method according to an exemplary embodiment of the disclosure, the third region of the buffer layer is formed as a flat structure.

According to a third aspect of embodiments of the disclosure, there is provided a display device comprising the array substrate as described in any one of the above embodiments.

In the array substrate and the method for manufacturing the same according to the embodiments of the disclosure, the first electrode layer is formed on the substrate of the array substrate, the pixel defining layer having the opening for exposing the first electrode layer is formed on the first electrode layer, and the second region of the first electrode layer adjacent to the inner side of the pixel defining layer is formed as the first arc structure. Therefore, it is possible to allow respective film layers of the organic material functional layer to be more smoothly connected with the pixel defining layer when forming the organic material functional layer at a position of the first electrode layer corresponding to the opening. Further, it is possible to reduce an area of the original material functional layer which cannot uniformly emit lights, thereby increasing an area of the original material functional layer which can uniformly emit the lights. A thickness each film layer of the organic material functional layer at a position, which is close to the pixel defining layer is uniform, which avoids uneven brightness from being generated in a display, thereby improving display quality of images of the display device.

BRIEF DESCRIPTION OF THE DRAWINGS

In order to more clearly explain technical solutions according to embodiments of the present disclosure or in the prior art, accompanying drawings for illustrating the embodiments or the prior art will be briefly introduced below. Obviously, the related accompanying drawings merely show a portion of the embodiments of the present disclosure, and it is possible for the person skilled in the art to obtain other accompanying drawings based on these accompanying drawings, without creative efforts.

REFERENCE LIST

Figure 1:
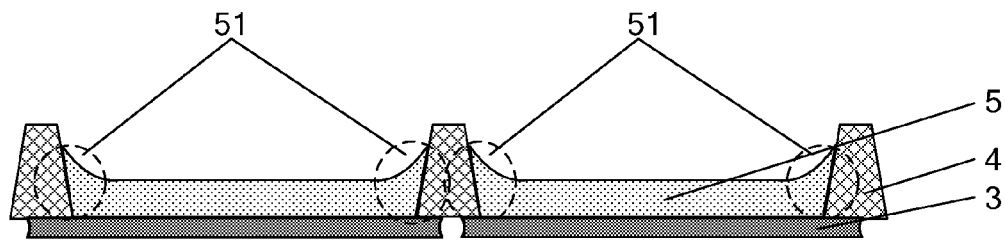
FIG. 1 is partial schematic section view of an array substrate in the prior art.

1: substrate
2: thin film transistor
3: a first electrode layer
4: pixel defining layer
5: organic material functional layer
6: buffer layer

DETAILED DESCRIPTION OF PREFERRED EMBODIMENTS OF THE INVENTION

Embodiments of the disclosure will be clearly and completely described hereinafter with reference the accompanying drawings in exemplary embodiments of the disclosure. Obviously, the described embodiments are merely part of the embodiments of the disclosure, rather than all of the embodiments of the disclosure. Based on the embodiments of the disclosure, all other embodiments made by those skilled in the art without any inventive step will fall within the scope of the disclosure.

In addition, in the following detailed description, for explanations and interpretations, lots of specific details are illustrated in order to provide a full understanding on embodiments of the present invention. However, obviously, one or more embodiments without these specific details may also be implemented. In other cases, known structures and devices are schematically embodied so as to simplify the accompanying drawings.

According to a general inventive concept of the disclosure, there is provided an array substrate comprising a substrate; a first electrode layer formed on the substrate; a pixel defining layer (PLD) formed on the first electrode layer, the pixel defining layer having an opening for exposing the first electrode layer; and an organic material functional layer formed on a region of the first electrode layer corresponding to the opening. The first electrode layer comprises: a first region located at a central portion of the first electrode layer; a second region located between a periphery of the first region and an inner side of the pixel defining layer and adjacent to the pixel defining layer, the second region being formed as a first arc structure protruding toward the substrate; and a third region located at a periphery of the second region and covered with the pixel defining layer.

Figure 2:
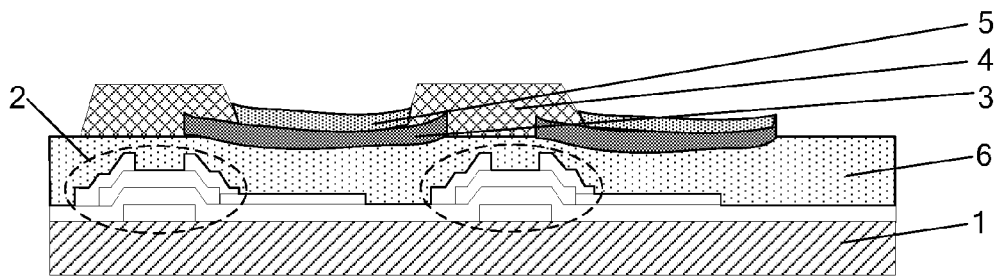
FIG. 2 is a schematic partial section view of an array substrate according to a first exemplary embodiment of the disclosure.
Figure 3:
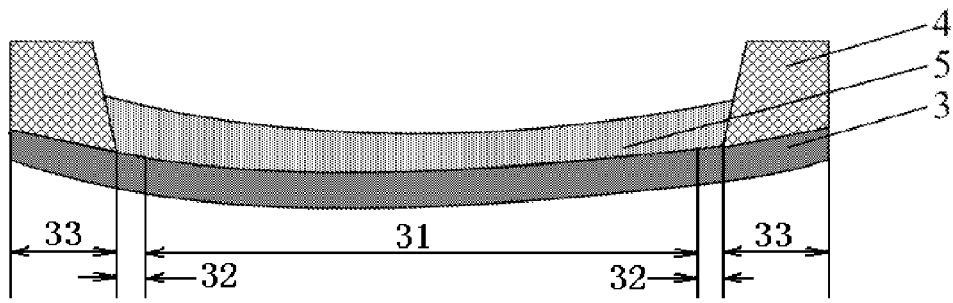
FIG. 3 is a partial schematic section view of a sub-pixel unit of the array substrate according to the first exemplary embodiment of the disclosure.

Referring to FIGS. 2 and 3, an array substrate according to an exemplary embodiment of the disclosure comprises a substrate 1; a first electrode layer 3 formed on the substrate 1; a pixel defining layer 4 formed on the first electrode layer 3 and having an opening for exposing the first electrode layer 3; and an organic material functional layer 5 formed on a region of the first electrode layer 3 corresponding to the opening. The first electrode layer 3 includes a first region 31, a second region 32 and a third region 33 sequentially arranged from the inside out. Specifically, the first region 31 is located at a central portion of the first electrode layer 3, the second region 32 is located between a periphery of the first region 31 and an inner side of the pixel defining layer 4 and adjacent to the pixel defining layer, and the third region 33 is located outside the second region 32 and covered with the pixel defining layer 4. The second region 32 is formed as a first arc structure protruding toward the substrate 1.

In this way, projections of the second region 32 and the third region 33 in a plane are both formed to have a predetermined annular shape. It would be appreciated that the second region 32 has a predetermined width and extends radially outwardly from the first region 31 to be connected with the pixel defining layer 4 at an inner side thereof. However, the second region 32 does not extend underneath a lower portion of the pixel defining layer 4. In an exemplary embodiment of the disclosure, the substrate 1 is formed with a plurality of sub-pixel units each including the first electrode layer 3, the pixel defining layer 4 and the organic material functional layer 5.

The array substrate according to the embodiments of the disclosure is applicable to an Organic Light-Emitting Diode (referred to as OLED), and the first electrode layer 3 may be used as an anode or a cathode. Specifically, an Active Matrix Organic Light-Emitting Diode (AMOLED) will be described in below as taking an example. As shown in FIG. 2, the substrate 1 is further provided with a thin film transistor 2 thereon. Of course, the embodiments of the disclosure are also applicable to a Passive Matrix Organic Light-Emitting Diode (PMOLED). In this case, the array substrate may not be provided with the thin film transistor.

In an exemplary embodiment of the disclosure, the thin film transistor includes a gate electrode, a gate insulation layer, a semiconductor active layer, a source electrode and a drain electrode. The thin film transistor may be a top-gate-type or a bottom-gate-type and is not limited herein. Further, a top-gate-type thin film transistor or a bottom-gate-type thin film transistor is defined depending on position of the gate electrode with respect to the gate insulation layer. That is, the thin film transistor may be the bottom-gate-type thin film transistor when the gate electrode is close to the substrate and the gate insulation layer is far away from the substrate, or may be the top-gate-type thin film transistor when the gate electrode is far away from the substrate and the gate insulation layer is close to the substrate. The first electrode layer may be made of Indium Tin Oxides (ITO).

It is noted that the accompanying drawings of all embodiments of the disclosure schematically depict pattern layers associated with the inventive idea, and do not depict or only depict a part of the pattern layers irrelative to the inventive idea. Further, the accompanying drawings merely illustrate a structure of one kind of the array substrate, and array substrates having other structures which may be suitable for the disclosure are also feasible.

In the array substrate according to embodiments of the disclosure, the first electrode layer is formed on the substrate of the array substrate, the pixel defining layer having the opening for exposing the first electrode layer is formed on the first electrode layer, and the second region of the first electrode layer adjacent to the inner side of the pixel defining layer is formed as the arc structure. In this way, it is possible to allow respective film layers of the organic material functional layer to be more smoothly brought into contact with the pixel defining layer when forming the organic material functional layer at a position of the first electrode layer corresponding to the opening. Further, it is possible to reduce an area of the original material functional layer which cannot uniformly emit lights, thereby increasing an area of the original material functional layer which can uniformly emit the lights. A thickness of each film layer of the organic material functional layer at a position, which is close to the pixel defining layer, is uniform, which avoids uneven brightness from being generated in a display device, thereby improving display quality of images of the display device.

Further, as shown in FIGS. 2 and 3, the first region 31 of the first electrode layer 3 is formed as a second arc structure protruding toward the substrate 1 and smoothly connected with the first arc structure.

Figure 4:
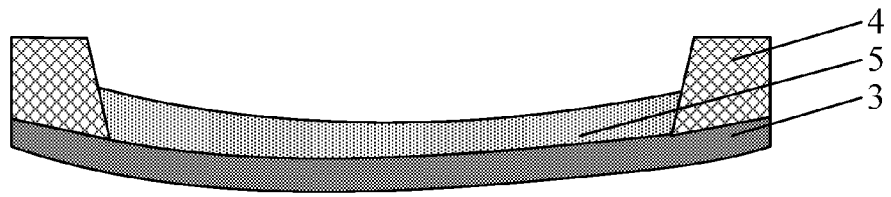
FIG. 4 is a partial schematic section view of a sub-pixel unit of an array substrate according to a second exemplary embodiment of the disclosure.
Figure 5:
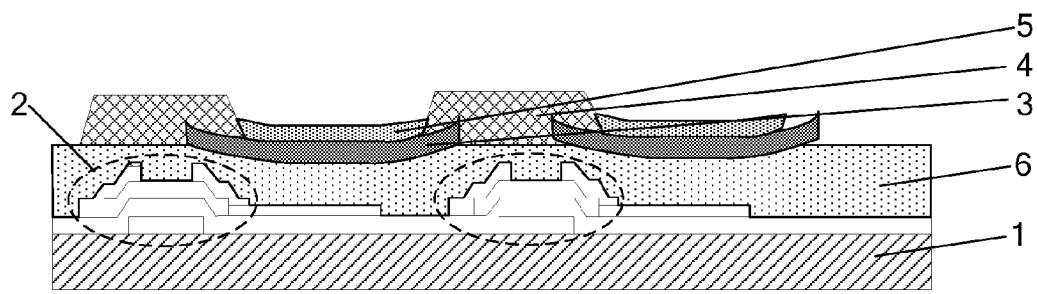
FIG. 5 is a partial schematic section view of the array substrate according to the second exemplary embodiment of the disclosure.

In an alternatively embodiment of the disclosure, as shown in FIGS. 4 and 5, the first region 31 of the first electrode layer 3 is formed as a flat structure smoothly connected with the first arc structure.

Further, as illustrated in FIG. 3, a region of the organic material functional layer 5 corresponding to the second region 32 of the first electrode layer 3 is formed as a third arc structure protruding toward the substrate 1.

In an exemplary embodiment of the disclosure, the first electrode layer 3 is used as an anode, and the organic material functional layer 5 includes at least an electron transport layer, a light emitting layer and a hole transport layer. In order to improve injection efficiency of electrons and holes into the light emitting layer, the organic material functional layer 5 may further include an electron injection layer disposed between a cathode and the electron transport layer and a hole injection layer between the anode and the hole transport layer. The bending degree of the arc structure of the organic material functional layer is not limited herein. In a specific application, it is possible to determine the bending degree of the arc structure of the organic material functional layer based on the arc structure of the first electrode layer, a thickness of the organic material functional layer and the like. It should be understood that a shape of the organic material functional layer should be conformed with that of the first electrode layer.

Further, as shown in FIG. 3, a region of the organic material functional layer 5 corresponding to the first region of the first electrode layer 3 is formed as a fourth arc structure protruding toward the substrate and smoothly connected with the third arc structure.

In an alternatively embodiment, as illustrated in FIG. 5, the region of the organic material functional layer 5 corresponding to the first region of the first electrode layer 3 is formed as a flat structure, which is smoothly connected with the third arc structure.

During manufacturing the display device according to the embodiments of the disclosure, the respective film layers of the organic material functional layer are generally formed through an evaporation process and a solution process due to particularity of materials thereof. In order to ensure molecules of the materials of the formed film layers can accurately flow into corresponding positions, it is necessary to pre-form the pixel defining layer on the first electrode layer after forming the first electrode layer. According to the embodiments of the disclosure, when forming the first electrode layer, the first electrode layer is formed to have the first arc structure. In this way, it is not necessary to specially select materials of the pixel defining layer with excellent properties when forming the pixel defining layer on the first electrode layer. In addition, it is not necessary to finely adjust a solvent composition of a solution of the organic material functional layer when forming the organic material functional layer. At the same time, there is no special necessarity to control conditions of forming the films such as a drying temperature of the solution, a pressure and the like. Therefore, it is possible to greatly reduce difficulty of the development and the manufacturing cost.

Figure 6:
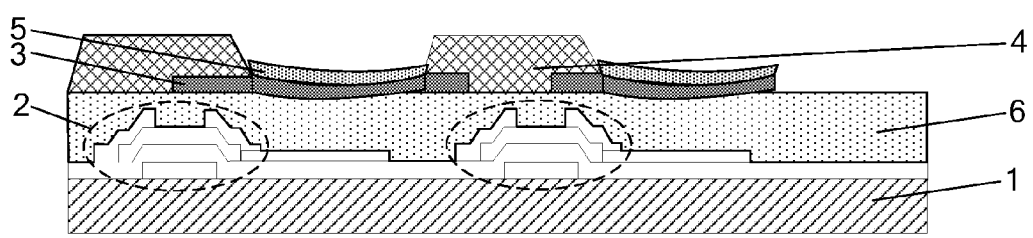
FIG. 6 is a partial schematic section view of an array substrate according to a third exemplary embodiment of the disclosure.
Figure 7:
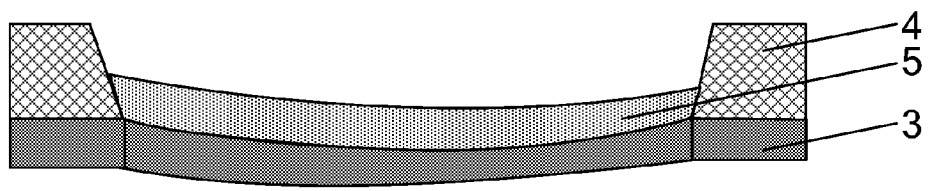
FIG. 7 is a partial schematic section view of a sub-pixel unit of the array substrate according to the second exemplary embodiment of the disclosure.

In a further embodiment, as shown in FIGS. 6 and 7, the third region 33 of the first electrode layer 3 corresponding to the pixel defining layer 4 may be formed as a flat structure smoothly connected with the first arc structure or an arc structure protruding toward the substrate 1 and smoothly connected with the first arc structure.

In the above embodiments, the bending degrees of the first, second, third and fourth arc structures are not limited specially, and may be determined depending on the actual requirements; respective thicknesses of the first electrode, the pixel defining layer and the organic material functional layer; a height relationship between the first electrode layer and the pixel defining layer; and other factors.

During the specific manufacturing process, the first electrode layer 3 is smoothly connected with the pixel defining layer 4, i.e., the shape of the pixel defining layer 4 would be conformed with that of the third region 33 of the first electrode layer 3.

In a further embodiment, as shown in FIGS. 2 and 6, the array substrate further comprises a buffer layer 6 disposed below and proximate to the first electrode layer 3. A region of the buffer layer 6 corresponding to the second region 32 of the first electrode layer 3 is formed as a fifth arc structure protruding toward the substrate 1.

In an exemplary embodiment of the disclosure, a region of the buffer layer 6 corresponding to the first region of the first electrode layer is formed as a sixth arc structure protruding toward the substrate 1 and smoothly connected with the fifth arc structure.

In an alternatively embodiment of the disclosure, as shown in FIG. 5, the region of the buffer layer 6 corresponding to the first region 31 of the first electrode layer 3 is formed as a flat structure, which is smoothly connected with the fifth arc structure of the buffer layer 6.

It is noted that in this embodiment the region of the buffer layer corresponding to the first region of the first electrode layer is formed as the flat structure, the first region of the first electrode layer is formed as the flat structure, and meanwhile, the region of the organic material functional layer corresponding to the first region of the first electrode layer is formed as the flat structure. Therefore, it is more beneficial to form the organic material functional layer during the specific manufacturing process, and the film layers thereof are formed at higher uniformity, which may further increase an area of the organic material functional layer for emitting the lights uniformly. At the same time, it is possible to ensure the manufacturing process is realized more easily.

In addition, as shown in FIG. 6, the third region 33 of the first electrode layer 3 corresponding to the pixel defining layer 4 is formed as the flat structure, the buffer layer 6 is also formed as the flat structure at a position of the pixel defining layer 6 corresponding to the third region 33, and the organic material functional layer 5 at a position corresponding to the first region 31 is formed as the arc structure. The uniformity of the thickness of each film layer of the formed organic material functional layer 5 at a position close to the pixel defining layer 4 is higher that of each film layer of the structure of the organic material functional layer 5 as shown in FIG. 3. Therefore, it is possible to increase the area of the organic material functional layer which may uniformly emit the lights. The smooth connection between the first electrode layer 3 and the pixel defining layer 4 may ensure uniformity of the formed films of the organic material functional layer 5 at the position adjacent to the pixel defining layer 4, so that the organic material functional layer 5 will emit the light more uniformly, thereby improving a light-emitting life of the display device.

In an exemplary embodiment of the disclosure, the first electrode layer 3 has a thickness of 30-200 nm. Further, a vertical distance between an upper surface of the pixel defining layer 4 and an upper surface of the arc structure of the first electrode layer 3 at the lowest position is less than or equal to 1.5 µm.

Specifically, since the first electrode layer has the thickness of 30-200 nm, and the vertical distance between an upper surface of the pixel defining layer 4 and an upper surface of the arc structure of the first electrode layer 3 at the lowest position is less than or equal to 1.5 µm, it is possible to define the bending degrees of the first arc structures of the finally formed first electrode layer and the organic material functional layer by making. Such design may avoid such problem that the finally formed display device has an excessively large thickness resulted from too large bending degrees of the first electrode layer and the organic material layer. Meanwhile, the too large bending degree of the organic material functional layer would increase the process difficulty, which in turn increases the manufacturing cost.

The bending degree of the first arc structure of the second region 32 in the first electrode layer 3 is relatively larger, and the bending degree of the second arc structure is relatively smaller. Horizontal lengths of portions having the relatively larger bending degree are about 10% of a total length of the first electrode layer, respectively. It is noted that the thickness of the pixel defining layer is not limited to the above embodiment, as long as the vertical distance between the upper surface of the pixel defining layer and the upper surface of the arc structure of the first electrode layer at the lowest position is ensure to be less than or equal to 1.5 µm in an actual design. In this case, it is possible to determine the thickness of the pixel defining layer based on the actual thickness of the first electrode layer, the bending degree of the first electrode layer and the actual requirements.

In an exemplary embodiment of the disclosure, the pixel defining layer 4 is made of a hydrophobic material. For example, the pixel defining layer may be made of a material having a better hydrophobic property and a low surface energy, such as silicon nitride, silicon oxynitrid, silicon oxide, acrylic, polyimide and the like.

In the embodiments of the disclosure, it is possible to firstly form an arc structure having a certain bending degree on the buffer layer of the array substrate through processes comprising exposure, development, etching and the like, then sputter an ITO film layer on the buffer layer having the arc structure, and thereafter form the first electrode layer through a certain process treatment. Of course, this embodiment is merely illustrated that the first electrode layer may be formed by the above method and is not intended to limited to this method. In the specific applications, appropriate methods may be selected based on the actual requirements and conditions.

In the array substrate according to the embodiments of the disclosure, the first electrode layer is formed on the substrate of the array substrate, the pixel defining layer having the opening for exposing the first electrode layer is formed on the first electrode layer, and the second region of the first electrode layer adjacent to the inner side of the pixel defining layer is formed as the first arc structure. In this way, the respective film layers of the organic material functional layer are more smoothly connected with the pixel defining layer when forming the organic material functional layer at the position of the first electrode layer corresponding to the opening region. Further, it is possible to reduce the area of the original material functional layer which cannot uniformly emit lights, thereby increasing an area of the original material functional layer which can uniformly emit the lights. The thickness of each film layer of the organic material functional layer at the position, which is close to the pixel defining layer, is uniform, which avoids uneven brightness from being generated in the display, thereby improving the display quality of images of the display device.

Figure 8:
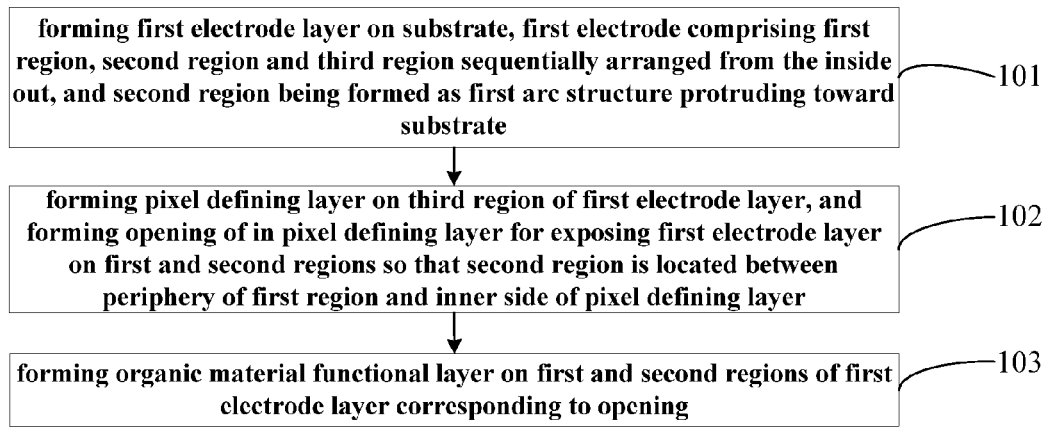
FIG. 8 is a schematic flow chart of a method for manufacturing an array substrate according to the first exemplary embodiment of the disclosure.

Referring to FIGS. 2, 3 and 8, a method for manufacturing an array substrate according to an exemplary embodiment of the disclosure comprises step S101 of forming a first electrode layer 3 on a substrate 1, wherein the first electrode layer 3 includes a first region 31, a second region 32 and a third region sequentially arranged from the inside out. The second region 32 is formed as a first arc structure protruding toward the substrate 1.

Specifically, it is possible to form a film layer having a thickness of 30-200 nm and made of ITO material through a sputtering process, thereafter to form the first electrode layer through patterning process treatments such as a photoresist coating process, a multi-tone exposure process, a development process, an etching process and the like. In the multi-tone exposure process, a multi-tone mask having a gradient transmittance is used to expose a photoresist, and then a first arc structure is formed on the first electrode layer through the development and etching processes. The first arc structure protrudes toward the substrate.

The method for manufacturing the array substrate according to an exemplary embodiment of the disclosure further comprises step S102 of forming a pixel defining layer 4 on the third region 33 of the first electrode layer 3, and forming an opening of the pixel defining layer 4 for exposing the first electrode layer 3 on the first region 31 and the second region 32, so that the second region 32 is located between a periphery of the first region 31 and an inner side of the pixel defining layer 4.

As shown in FIG. 3, a region of the first electrode layer 3 corresponding to the opening includes the first region 31 and the second region 32. The second region 32 has a predetermined width and extends radially outwardly from the first region 31 to be connected with the pixel defining layer 4 at the inner side thereof. However, the second region 32 does not extend below the pixel defining layer 4.

The method for manufacturing the array substrate according to an exemplary embodiment of the disclosure further comprises step S103 of forming an organic material functional layer 5 on a region of the first electrode layer 3 corresponding to the opening.

In an exemplary embodiment of the disclosure, the first electrode layer 3 is used as an anode or cathode, and the second region 32 of the first electrode layer 3 is formed as the first arc structure protruding toward the substrate 1. The organic material functional layer 5 for covering the first region 31 and the second region 32 is formed on the region of the first electrode layer 3 corresponding to the opening.

In the method for manufacturing the array substrate according to the first embodiment of the disclosure, the first electrode layer is formed on the substrate of the array substrate, the pixel defining layer having the opening for exposing the first electrode layer is formed on the first electrode layer, and the second region of the first electrode layer adjacent to the inner side of the pixel defining layer is formed as the first arc structure. Therefore, it is possible to allow respective film layers of the organic material functional layer to be more smoothly connected with the pixel defining layer when forming the organic material functional layer at a position of the first electrode layer corresponding to the opening. Further, it is possible to reduce an area of the original material functional layer which cannot uniformly emit lights, thereby increasing an area of the original material functional layer which can uniformly emit the lights. A thickness of each film layer of the organic material functional layer at a position, which is close to the pixel defining layer, is uniform, which avoids uneven brightness from being generated in a display, thereby improving display quality of images of the display device.

Figure 9:
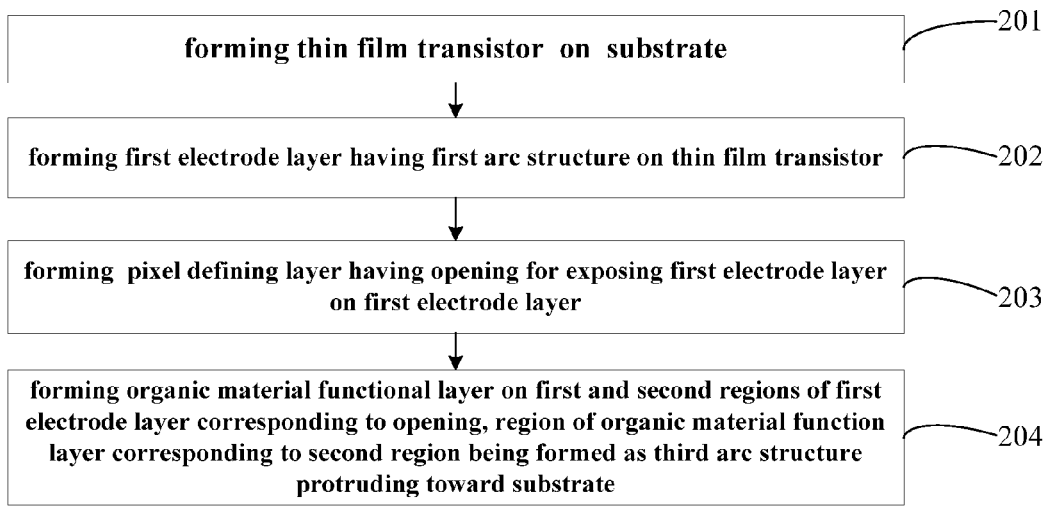
FIG. 9 is a schematic flow chart of a method for manufacturing an array substrate according to the second exemplary embodiment of the disclosure.

Referring to FIGS. 2 and 9, a method for manufacturing an array substrate according to a second embodiment of the disclosure comprises steps of:

S201: forming a thin film transistor 2 on a substrate 1; and

S202: forming a first electrode layer 3 having a first arc structure on the thin film transistor 2.

In an exemplary embodiment of the disclosure, the step of forming the first electrode layer 3 having the first arc structure on the thin film transistor 2 may include steps of:

a: forming a buffer layer 6 on the thin film transistor 2;

b: patterning the buffer layer 6 such that the buffer layer is formed, at a side thereof away from the substrate 1, with a fifth arc structure, the fifth arc structure corresponding to the second region 32 of the first electrode layer 3 and protruding toward the substrate 1; and c: forming the first electrode layer 3 on the buffer layer 6.

Specifically, it is possible to obtain the desired fifth arc structure through coating a layer of a positive or negative photoresist on the buffer layer 6, and then exposing the photoresist by means of a multi-tone mask, and thereafter developing the exposed photoresist. Then, thin film of the buffer layer which is not covered by the photoresist is etched away, and thereafter the buffer layer having a fifth arc structure and a sixth arc structure is obtained by a photoresist stripping process.

In an alternative embodiment of the disclosure, the fifth arc structure and the sixth arc structure may be obtained through a dry etching process. The fifth arc structure and the sixth arc structure are etched through controlling an ion beam to have a predetermined angle with respect to a normal of the buffer layer. The angle formed between the ion beam and the normal of the buffer layer may be selected according to specific requirements to the arc structures. For example, the angle may generally be 30°. The way of forming the arc structures of the buffer layer is not limited to the method as described above. The first arc structure protrudes toward the substrate.

The method for manufacturing the array substrate according to the second embodiment of the disclosure further comprises a step S203 of forming a pixel defining layer 4 having an opening for exposing the first electrode layer 3 on the first electrode layer.

For example, a hydrophobic material may be used to form the pixel defining layer 4 on the third region of the first electrode layer 3 through processes comprising forming film, exposure, development, drying and the like.

The method for manufacturing the array substrate according to the second embodiment of the disclosure further comprises a step S204 of forming an organic material functional layer 5 on the first region 31 and the second region 32 of the first electrode layer 3 corresponding to the opening, a region of the organic material function layer 5 corresponding to the second region 32 being formed as a third arc structure. In this way, both the first arc structure and the third arc structure protrude toward the substrate 1.

It is noted that the illustration of the same steps in the method according to the second embodiment as those according to the first embodiment may refer to the discussion to the method according to the first embodiment, and the description thereof in detail is omitted herein.

In the method for manufacturing the array substrate according to the second embodiment of the disclosure, the first electrode layer is formed on the substrate of the array substrate, the pixel defining layer having the opening for exposing the first electrode layer is formed on the first electrode layer, and the second region of the first electrode layer adjacent to the inner side of the pixel defining layer is formed as the first arc structure. Therefore, it is possible to allow respective film layers of the organic material functional layer to be more smoothly connected with the pixel defining layer when forming the organic material functional layer at a position of the first electrode layer corresponding to the opening. Further, it is possible to reduce an area of the original material functional layer which cannot uniformly emit lights, thereby increasing an area of the original material functional layer which can uniformly emit the lights. A thickness each film layer of the organic material functional layer at a position, which is close to the pixel defining layer, is uniform, which avoids uneven brightness from being generated in a display, thereby improving display quality of images of the display device.

Figure 10:
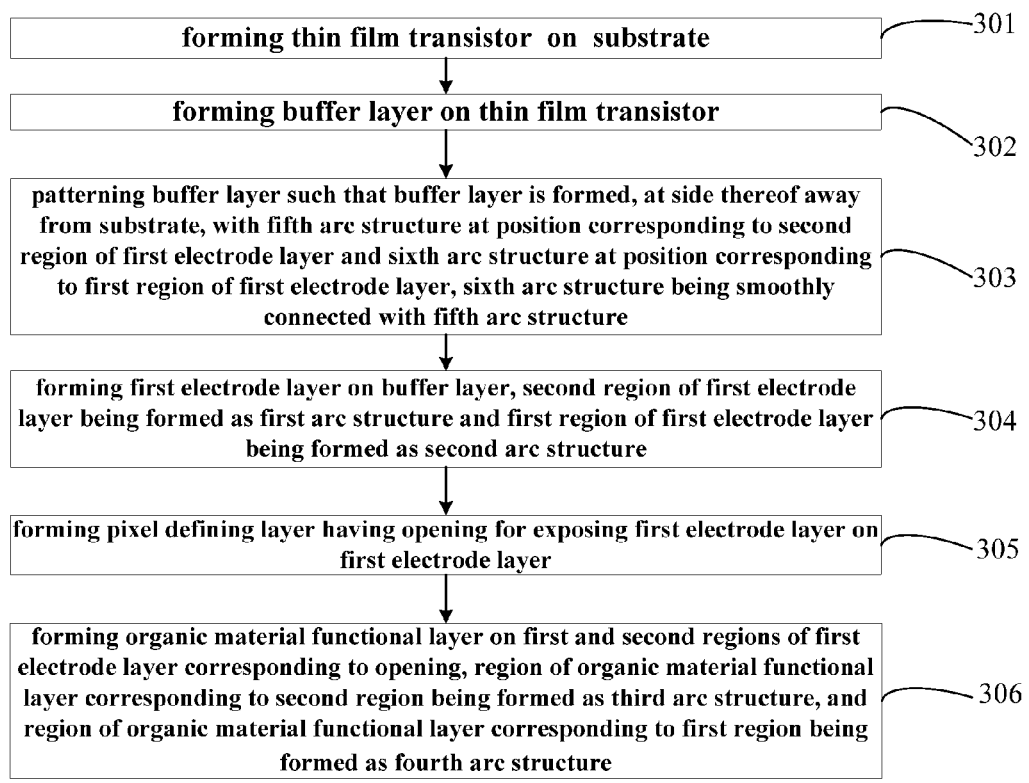
FIG. 10 is a schematic flow chart of a method for manufacturing an array substrate according to the third exemplary embodiment of the disclosure.

Referring to FIGS. 2 and 10, a method for manufacturing an array substrate according to a third embodiment of the disclosure comprises steps of:

S301: forming a thin film transistor 2 on a substrate 1;

S302: forming a buffer layer 6 on the thin film transistor 2; and

S303: patterning the buffer layer 6 such that the buffer layer 6 is formed, at a side thereof away from the substrate 1, with a fifth arc structure at a position of the buffer layer 6 corresponding to a second region 32 of a first electrode layer 3 and a sixth arc structure at a position of the buffer layer 6 corresponding to a first region 31 of the first electrode layer 3, the sixth arc structure being smoothly connected with the fifth arc structure. In this way, both the fifth and sixth arc structures protrude toward the substrate 1 and are smoothly connected with each other.

Specifically, it is possible to obtain the desired fifth and sixth arc structures through coating a layer of a positive or negative photoresist on the buffer layer 6, and then exposing the photoresist by means of a multi-tone mask, and thereafter developing the exposed photoresist. Then, thin film of the buffer layer which is not covered by the photoresist is etched away, and thereafter the buffer layer having the fifth and sixth arc structures is obtained through a photoresist stripping process.

In an alternative embodiment of the disclosure, the fifth and sixth arc structures may be obtained through a dry etching process. The arc structures are etched through controlling an ion beam to have a predetermined angle with respect to a normal of the buffer layer. The angle formed between the ion beam and the normal of the buffer layer may be selected according to specific requirements to the arc structures. For example, the angle may generally be 30°.

It may be understood that the way of forming the arc structures of the buffer layer is not limited to the methods as described above.

The method for manufacturing the array substrate according to the third embodiment of the disclosure further comprises a step S304 of forming the first electrode layer 3 on the buffer layer 6, a second region of the first electrode layer being formed as a first arc structure and a first region of the first electrode layer being formed as a second arc structure. The first and second arc structures protrude toward the substrate 1 and are smoothly connected with each other.

Specifically, it is possible to form a curved surface of the fifth arc structure having a predetermined bending degree on the buffer layer 6 through an etching process, and then sputter an ITO film layer on the curved surface, and thereafter form the first electrode layer having the first arc structure through patterning processes such as exposure, development, etching and the like.

The method for manufacturing the array substrate according to the third embodiment of the disclosure further comprises a step S305 of forming a pixel defining layer 4 having an opening for exposing the first electrode layer on the first electrode layer, wherein a vertical distance between an upper surface of the pixel defining layer 4 and an upper surface of the arc structure of the first electrode layer 3 at the lowest position is less than or equal to 1.5 μm.

The method for manufacturing the array substrate according to the third embodiment of the disclosure further comprises s step S306 of forming an organic material functional layer 5 on the first region 31 and the second region 32 of the first electrode layer 3 corresponding to the opening. A region of the organic material functional layer 5 corresponding to the second region 32 of the first electrode layer 3 is formed as a third arc structure, and a region of the organic material functional layer 5 corresponding to the first region 31 of the first electrode layer 3 is formed as a fourth arc structure. Both the third and fourth arc structures protrude toward the substrate and are smoothly connected with each other. In this embodiment, a third region 33 of the first electrode layer 3 corresponding to the pixel defining layer 4 may be formed as a flat structure.

It is noted that the illustration of the same steps in the method according to the third embodiment as those according to the first embodiment may refer to the discussion to the method according to the first embodiment, and the description thereof in detail is omitted herein.

In the method for manufacturing the array substrate according to the third embodiment of the disclosure, the first electrode layer is formed on the substrate of the array substrate, the pixel defining layer having the opening for exposing the first electrode layer is formed on the first electrode layer, and the second region of the first electrode layer adjacent to the inner side of the pixel defining layer is formed as the first arc structure. Therefore, it is possible to allow respective film layers of the organic material functional layer to be more smoothly connected with the pixel defining layer when forming the organic material functional layer at a position of the first electrode layer corresponding to the opening. Further, it is possible to reduce an area of the original material functional layer which cannot uniformly emit lights, thereby increasing an area of the original material functional layer which can uniformly emit the lights. A thickness each film layer of the organic material functional layer at a position, which is close to the pixel defining layer, is uniform, which avoids uneven brightness from being generated in a display, thereby improving display quality of images of the display device.

Figure 11:
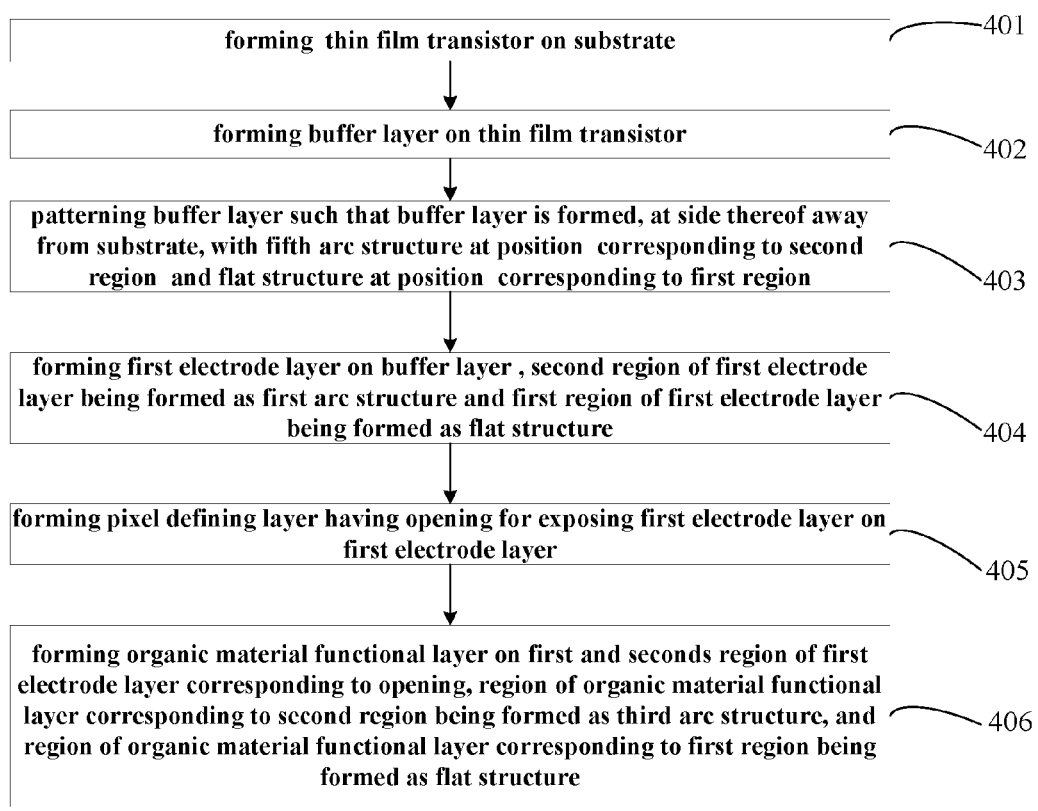
FIG. 11 is a schematic flow chart of a method for manufacturing an array substrate according to the fourth exemplary embodiment of the disclosure.

Referring to FIGS. 2 and 11, a method for manufacturing an array substrate according to a fourth embodiment of the disclosure comprises steps of:

S401: forming a thin film transistor 2 on a substrate 1;

S402: forming a buffer layer 6 on the thin film transistor 2; and

S403: patterning the buffer layer 6 such that the buffer layer 6 is formed, at a side thereof away from the substrate 1, with a fifth arc structure at a position of the buffer layer 6 corresponding to a second region 32 of a first electrode layer 3 and a flat structure at a position of the buffer layer 6 corresponding to a first region 31 of the first electrode layer 3.

Specifically, it is possible to obtain the desired fifth arc structure and the flat structure through coating a layer of a positive or negative photoresist on the buffer layer, and then exposing the photoresist by means of a multi-tone mask, and thereafter developing the exposed photoresist. Then, thin film of the buffer layer which is not covered by the photoresist is etched away, and thereafter the buffer layer having the fifth arc structure and the flat structure is obtained through a photoresist stripping process.

In an alternative embodiment of the disclosure, the fifth arc structure may be obtained through a dry etching process. The arc structure is etched through controlling an ion beam to have a predetermined angle with respect to a normal of the buffer layer. The angle formed between the ion beam and the normal of the buffer layer may be selected according to specific requirements to the arc structures. For example, the angle may generally be 30°. The way of forming the arc structures of the buffer layer is not limited to the method as described above.

It may be understood that the way of forming the arc structure of the buffer layer is not limited to the method as described above.

In this embodiment, the second arc structure protrudes toward the substrate 1.

The method for manufacturing the array substrate according to the fourth embodiment of the disclosure further comprises steps of:

step S404: forming the first electrode layer 3 on the buffer layer 6, a second region 32 of the first electrode layer 3 being formed as a first arc structure and a first region 31 of the first electrode layer 3 being formed as a flat structure, the first arc structure and the flat structure being smoothly connected with each other;

step S405: forming a pixel defining layer having an opening for exposing the first electrode layer on the first electrode layer; and step S406: forming an organic material functional layer 5 on the first region 31 and the second region 32 of the first electrode layer 3 corresponding to the opening, a region of the organic material functional layer 5 corresponding to the second region 32 of the first electrode layer 3 being formed as a third arc structure, and a region of the organic material functional layer 5 corresponding to the first region 31 of the first electrode layer 3 being formed as a flat structure. The third arc structure protrudes toward the substrate 1 and is smoothly connected with the flat structure. In addition, a region of the buffer layer 6 corresponding to the pixel defining layer is formed as a flat structure.

It is noted that the illustration of the same steps in the method according to the fourth embodiment as those according to the first embodiment may refer to the discussion to the method according to the first embodiment, and the description thereof in detail is omitted herein.

In the method for manufacturing the array substrate according to the fourth embodiment of the disclosure, the first electrode layer is formed on the substrate of the array substrate, the pixel defining layer having the opening for exposing the first electrode layer is formed on the first electrode layer, and the second region of the first electrode layer adjacent to the inner side of the pixel defining layer is formed as the first arc structure. Therefore, it is possible to allow respective film layers of the organic material functional layer to be more smoothly connected with the pixel defining layer when forming the organic material functional layer at a position of the first electrode layer corresponding to the opening. Further, it is possible to reduce an area of the original material functional layer which cannot uniformly emit lights, thereby increasing an area of the original material functional layer which can uniformly emit the lights. A thickness each film layer of the organic material functional layer at a position, which is close to the pixel defining layer, is uniform, which avoids uneven brightness from being generated in a display, thereby improving display quality of images of the display device.

According to a further embodiment of the disclosure, there is provided a display device comprising the array substrate according to any one of the above described embodiments. The display device may include an OLED panel, a mobile phone, a tablet PC, a television, a display, a laptop, a digital photo frame, a navigator and any other products or components having display function.

In the display device according to embodiments of the disclosure, the first electrode layer is formed on the substrate of the array substrate, the pixel defining layer having the opening for exposing the first electrode layer is formed on the first electrode layer, and the second region of the first electrode layer adjacent to the inner side of the pixel defining layer is formed as the first arc structure. Therefore, it is possible to allow respective film layers of the organic material functional layer to be more smoothly connected with the pixel defining layer when forming the organic material functional layer at a position of the first electrode layer corresponding to the opening. Further, it is possible to reduce an area of the original material functional layer which cannot uniformly emit lights, thereby increasing an area of the original material functional layer which can uniformly emit the lights. A thickness each film layer of the organic material functional layer at a position, which is close to the pixel defining layer, is uniform, which avoids uneven brightness from being generated in a display, thereby improving display quality of images of the display device.

The above discussions are merely the embodiments of the disclosure, and the scope of the disclosure is not limited thereto. Various changes or modifications easily envisaged by those skilled in the art within the scope disclosed by the disclosure should fall within the scope of the disclosure. Therefore, the scope of the disclosure should be defined solely by the appended claims.

What is claimed is:

1. An array substrate, comprising:
    a substrate;
    a first electrode layer formed on the substrate;
    a pixel defining layer formed on the first electrode layer and having an opening for exposing the first electrode layer; and
    an organic material functional layer formed on a region of the first electrode layer corresponding to the opening, wherein the first electrode layer comprises:
        a first region located at a central portion of the first electrode layer;
        a second region located between a periphery of the first region and an inner side of the pixel defining layer, the second region being formed as a first arc structure protruding toward the substrate; and
        a third region located outside the second region and covered by the pixel defining layer, the third region being formed as a third arc structure smoothly connected with the first arc structure; and
    wherein the first region is formed as a second arc structure protruding toward the substrate and smoothly connected with the first arc structure, a bending degree of the first arc structure being larger than a bending degree of the second arc structure.

2. The array substrate according to claim 1, wherein the third region is formed as a flat structure smoothly connected with the first arc structure or as an arc structure protruding toward the substrate and smoothly connected with the first arc structure.

3. The array substrate according to claim 1, wherein a region of the organic material functional layer corresponding to the second region is formed as a third arc structure protruding toward the substrate.

4. The array substrate according to claim 1, further comprising a buffer layer disposed below and proximate to the first electrode layer, wherein a region of the buffer layer corresponding to the second region is formed as a fifth arc structure protruding toward the substrate.

5. A display device, comprising the array substrate according to claim 1.

6. The array substrate according to claim 3, wherein a region of the organic material functional layer corresponding to the first region is formed as a fourth arc structure protruding toward the substrate and smoothly connected with the third arc structure.

7. The array substrate according to claim 4, wherein a region of the buffer layer corresponding to the first region is formed as a sixth arc structure protruding toward the substrate and smoothly connected with the fifth arc structure.

8. A method for manufacturing an array substrate, comprising steps of:
    forming a first electrode layer on a substrate, the first electrode comprising a first region, a second region and a third region sequentially arranged from the inside out, and the second region being formed as a first arc structure protruding toward the substrate, the first region being formed as a second arc structure protruding toward the substrate and smoothly connected with the first arc structure, the third region being formed as a third arc structure smoothly connected with the first arc structure, and a bending degree of the first arc structure being larger than a bending degree of the second arc structure;
    forming a pixel defining layer on the third region of the first electrode layer, and forming an opening in the pixel defining layer for exposing the first electrode layer on the first region and the second region so that the second region is located between a periphery of the first region and an inner side of the pixel defining layer; and
    forming an organic material functional layer on the first region and the second region of the first electrode layer corresponding to the opening.

9. The method according to claim 8, wherein the step of forming the first electrode layer on the substrate comprises steps of:

forming a buffer layer on the substrate;

patterning the buffer layer such that the buffer layer is formed, at a side thereof away from the substrate, with a fifth arc structure, the fifth arc structure corresponding to the second region of the first electrode layer and protruding toward the substrate; and forming the first electrode layer on the buffer layer.

10. The method according to claim 8, wherein the step of forming the first electrode layer on the substrate comprises steps of:

forming a buffer layer on the substrate;

patterning the buffer layer such that the buffer layer is formed, at a side thereof away from the substrate, with a fifth arc structure at a position corresponding to the second region and a sixth arc structure at a position corresponding to the first region, wherein both the fifth and sixth arc structures protrude toward the substrate and are smoothly connected with each other; and forming the first electrode layer on the buffer layer, so that the first region of the first electrode layer is formed as a second arc structure protruding toward the substrate and smoothly connected with the first arc structure.

11. The method according to claim 8, wherein in the step of forming the organic material functional layer on the region of the first electrode layer corresponding to the opening, a region of the organic material functional layer corresponding to the second region is formed as a third arc structure protruding toward the substrate.

12. The method according to claim 8, wherein the third region of the first electrode layer is formed as a flat structure smoothly connected with the first arc structure.

13. The method according to claim 11, in the step of forming the organic material functional layer on the first region and the second region of the first electrode layer corresponding to the opening, a region of the organic material functional layer corresponding to the first region is formed as a fourth arc structure protruding toward the substrate and smoothly connected with the third arc structure.

14. The method according to claim 12, wherein a region of the buffer layer corresponding to the third region is formed as a flat structure.

\* \* \* \* \*